(12) United States Patent
Sun

(10) Patent No.: US 6,809,670 B2
(45) Date of Patent: Oct. 26, 2004

(54) CURRENT-STEERING/REPRODUCING DIGITAL-TO-ANALOG CURRENT CONVERTER

(75) Inventor: Wein-Town Sun, Kao-Hsiung (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/249,752

(22) Filed: May 5, 2003

(65) Prior Publication Data
US 2004/0174281 A1 Sep. 9, 2004

(30) Foreign Application Priority Data
Mar. 7, 2003 (TW) .......................... 92105023 A

(51) Int. Cl.⁷ ............................. H03M 1/00
(52) U.S. Cl. .................. 341/136; 341/135; 341/144
(58) Field of Search ......................... 341/135–136, 341/144; 323/116

(56) References Cited

U.S. PATENT DOCUMENTS

| | | | | |
|---|---|---|---|---|
| 5,703,582 A | * | 12/1997 | Koyama et al. | 341/120 |
| 5,870,049 A | * | 2/1999 | Huang et al. | 341/144 |
| 6,373,419 B1 | * | 4/2002 | Nakao | 341/154 |
| 6,473,015 B2 | * | 10/2002 | Andersson | 341/136 |
| 6,542,098 B1 | * | 4/2003 | Casper et al. | 341/144 |
| 6,559,784 B1 | * | 5/2003 | Schofield et al. | 341/144 |

* cited by examiner

Primary Examiner—Michael Tokar
Assistant Examiner—Khai Nguyen
(74) Attorney, Agent, or Firm—Winston Hsu

(57) ABSTRACT

A current-steering/reproducing digital-to-analog current converting circuit includes a digital-to-analog current converter for converting a digital signal into analog current signal, a current-storing/reproducing module, and a control circuit. The current-storing/reproducing module is used to store a predetermined voltage for conducting the analog current signal in a transforming/storing status and to conduct a reproducing current to a data line in a reproducing/sustaining status. The control circuit is electrically connected between the digital-to-analog current converting device and the current-storing/reproducing module for providing a switch between the transforming/storing status and the reproducing/sustaining status.

22 Claims, 7 Drawing Sheets

CURRENT-STEERING/REPRODUCING DIGITAL-TO-ANALOG CURRENT CONVERTER

BACKGROUND OF INVENTION

1. Field of the Invention

The invention relates to a digital-to-analog current converting circuit, and more particularly, to a current-storing/reproducing digital-to-analog current converting circuit including a current storing/reproducing module.

2. Description of the Prior Art

An OLED (Organic Light Emitting Device, OLED) display can be designed as a thin, flat panel display device. The OLED display can be found in a plethora of electronic goods, ranging from notebook computers and digital cameras, to flight avionics and medical diagnostic tools. OLEDs offer crisp, high-resolution images, and have the primary advantage of offering relatively low power-consumption while still maintaining good color contrast and screen refresh rates. In recent years, many OLED manufacturing procedures include a LTPS TFT (Low Temperature Poly Silicon Thin Film Transistor) processing technique.

For achieving advantages of power saving, integrity, and cost effectiveness, more OLED systems adopt the digital type as an input data type so that the digital-to-analog converter should be involved in the data driver. In addition, the brightness of the OLED display is controlled by current. Therefore, the digital-to-analog process should be achieved by a digital-to-analog current converting to convert digital data into an analog current signal. The corresponding pixel is also a current-driving pixel. Please refer to FIG. 1, which is a functional block diagram of a prior-art data driver 10. The data driver 10 corresponds to a pixel 20 of a display device. The data driver 10 includes a level shifter 12, a latch 14, a shift register 16, and a digital-to-analog current converter 18. The level shifter 12 is used to adjust the potential levels of a received digital signal (a 6-bit digital signal), and the latch 14 is electrically connected to the level shifter 12 for buffering the digital signal. The latch 14 can temporarily store the 6-bit the digital signal so that the latch 14 is a 6-bit latch. The shift register 16 can be used to generate a shift-register signal to transmit the digital signal to the level shifter 12 at one time. Afterwards, the level shifter 12 will execute the potential-level adjusting and buffering functions and transmit the digital signal to the latch 14. The digital-to-analog current converter 18 is connected to the latch 14 for receiving the digital signal outputted from the latch 14. The digital-to-analog current converter 18 can be used to transform the digital data into an analog current signal and to output the analog current signal to a data line 19. According to the amplitude of the analog current signal, the gray colors of the display panel can be determined.

Taking a display panel with 4-bit input digital data as an example, J. Kanicki et.al. (U. of Michigan, USA) has disclosed a simple digital-to-analog current converter installed with a set of TFTs (Thin Film Transistors) with width-to-length ratio assigned as 1:2:4:8 and a current source to generate 16 current gray scales, I. Please refer to FIG. 2, which is a schematic diagram of an embodiment of a prior-art digital-to-analog current converter 18 as shown in FIG. 1. The digital-to-analog current converter 18 is composed of a plurality of transistors T0–T4. Due to that the 16 current gray scales rely on 4 (1:2:4:8) TFTs T1–T4, any fluctuation of threshold potential level and mobility in each TFT will generate significant variation to affect the current gray scales. Furthermore, the quality of the corresponding panel will be influenced. In addition, because the output impedance of the digital-to-analog current converter 18 is not high enough, the output potential level will be affected by a current flow passing the digital-to-analog current converter 18. Therefore, when the digital-to-analog current converter 18 is connected to the corresponding pixel, the output current may not be a stable 16 gray-scale current.

SUMMARY OF INVENTION

It is therefore a primary objective of the claimed invention to provide a current storing/reproducing digital-to-analog current converting circuit to conduct a duplicate current signal in a reproducing/sustaining status to solve the above-mentioned problems.

According to the claimed invention, a digital-to-analog current converting circuit comprises a digital-to-analog current converter for transforming a digital signal into an analog current signal; a current storing/reproducing module for storing a predetermined voltage required for conducting the analog current signal in a transforming/storing status and for conducting a duplicate current signal to a data line in a reproducing/sustaining status; and a control circuit electrically connected between the digital-to-analog current converter and the current storing/reproducing module for switching the digital-to-analog current converting circuit between the transforming/storing status and the reproducing/sustaining status.

According to the claimed invention, a digital-to-analog current converting circuit used in a display device is disclosed. The digital-to-analog current converting circuit comprises a current-steering digital-to-analog current converter for transforming a received digital signal into an analog current signal; a plurality of current storing/reproducing modules, each current storing/reproducing module used for storing a predetermined voltage required for conducting the analog current signal in a corresponding transforming/storing status and for conducting a duplicate current signal to the corresponding data line in a corresponding reproducing/sustaining status; and a plurality of control circuits respectively electrically connected between the digital-to-analog current converter and the plurality of current storing/reproducing modules for switching the plurality of current storing/reproducing modules between the transforming/storing status and the reproducing/sustaining status; wherein each duplicate current signal generated by each current storing/reproducing module is almost equal to the analog current signal.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
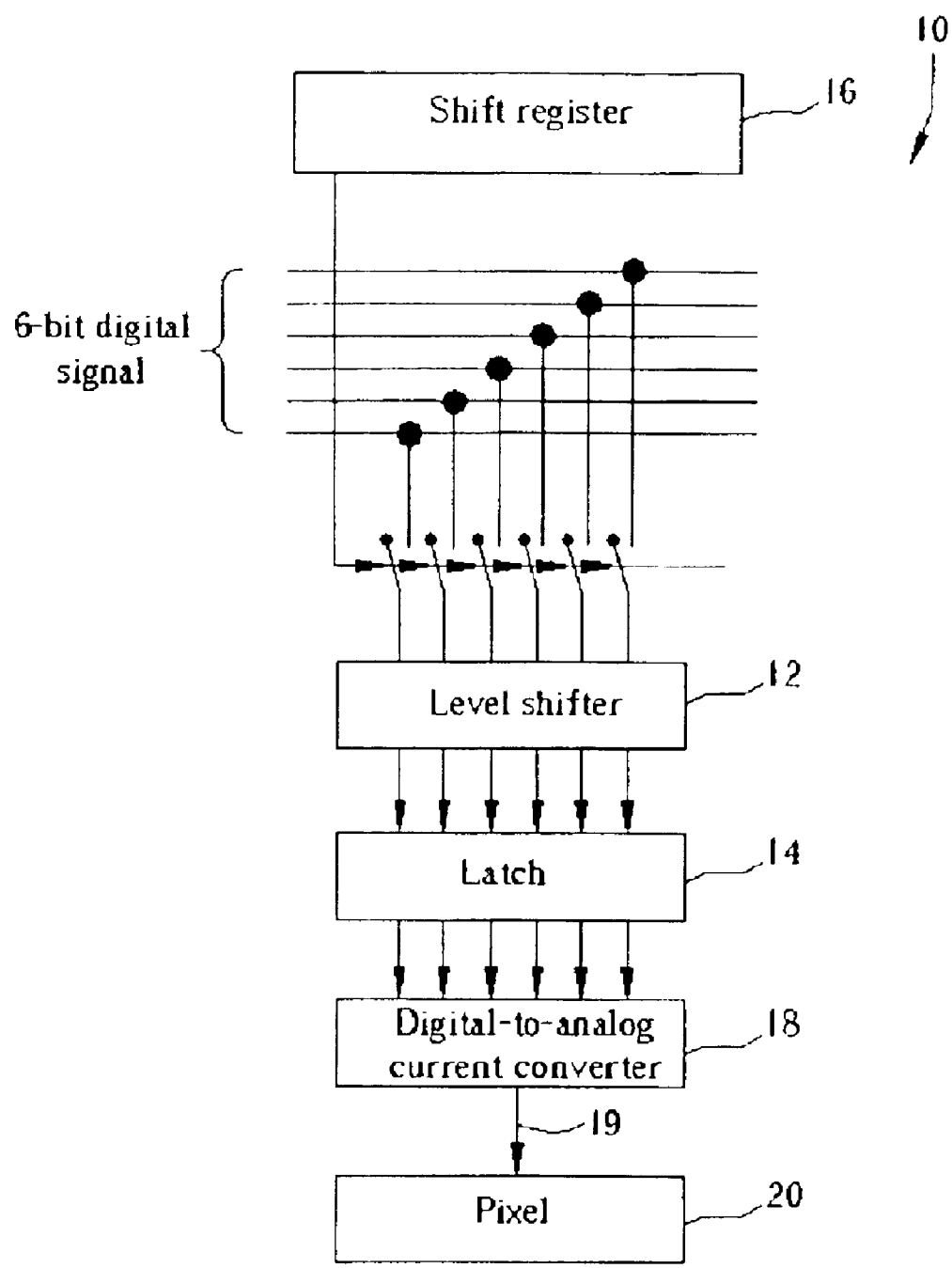
FIG. 1 is a functional block diagram of a data driver according to the prior art.
Figure 2:
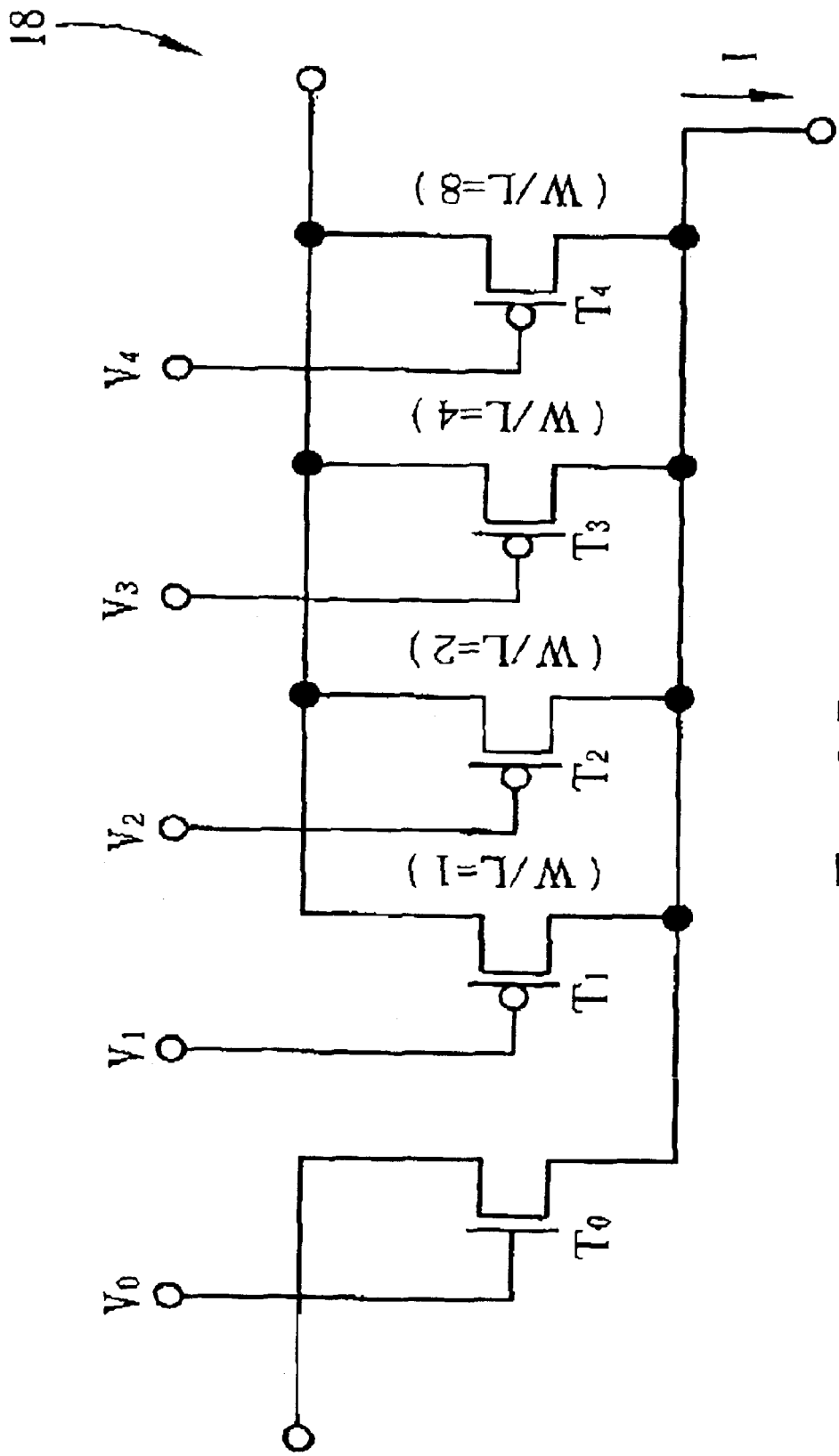
FIG. 2 is a schematic diagram of an embodiment of a prior-art digital-to-analog current converter as shown in FIG. 1.
Figure 3:
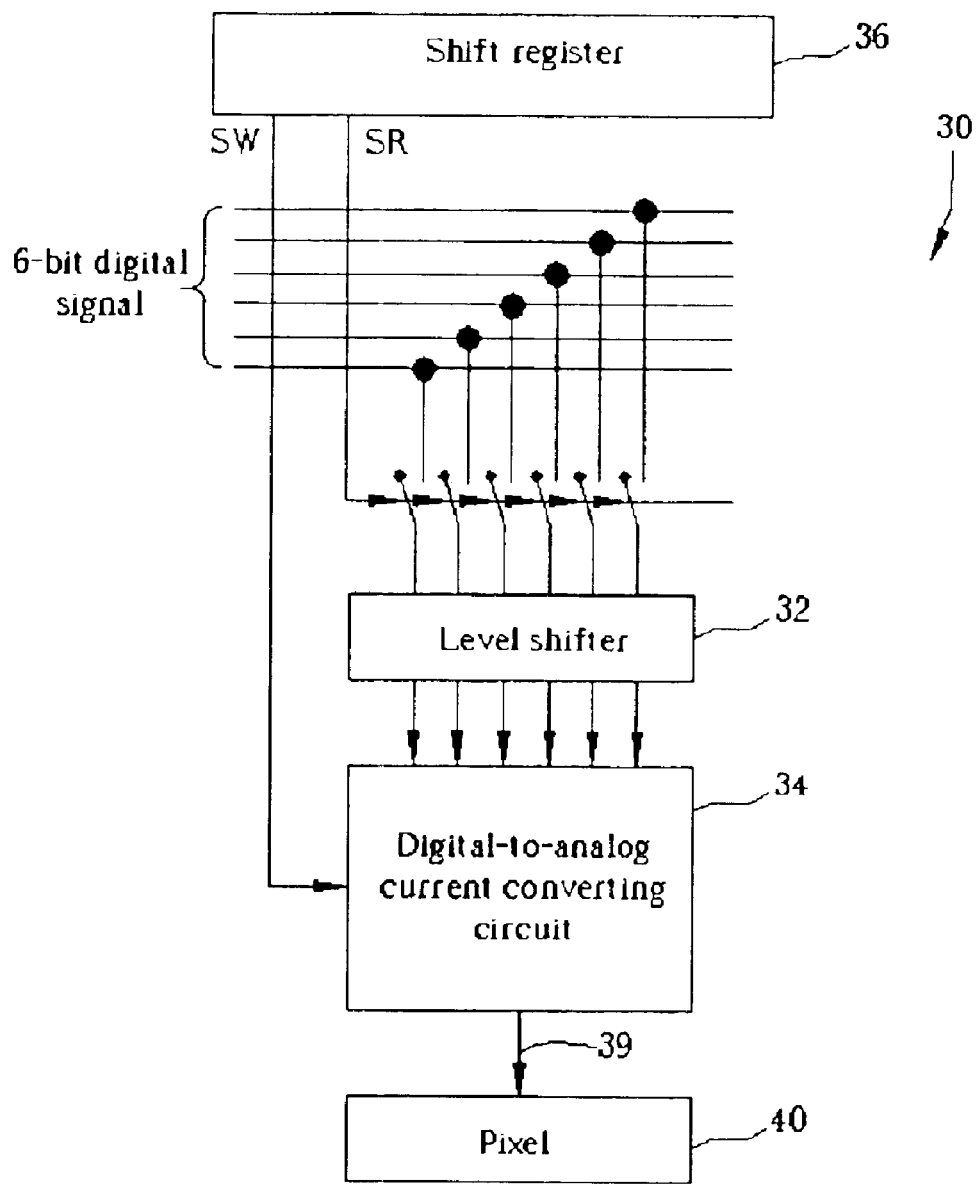
FIG. 3 is a functional block diagram of a data driver according to the present invention.

Please refer to FIG. 3, which is a functional block diagram of a data driver 30 according to the present invention. The data driver 30 corresponds to a pixel 40 of a display device. The data driver 30 includes a level shifter 32, a shift register 36, and a digital-to-analog current converting circuit 34. The level shifter 32 is used adjust the potential levels of a received digital signal (a 6-bit digital signal), and to buffer the digital signal. The shift register 36 can be used to generate a shift-register signal SR and a switch signal SW. The shift-register signal SR is used to transmit the digital signal to the level shifter 32 at one time, and the level shifter 32 can execute adjusting and buffering functions and then deliver the digital signal to the digital-to-analog current converting circuit 34. The switch signal SW is used to switch the digital-to-analog current converting circuit 34 between a transforming/storing status and a reproducing/sustaining status. The digital-to-analog current converting circuit 34 can be used to receive the digital signal outputted from the level shifter 32 and to transform the digital data into a duplicate current signal. The digital-to-analog current converting circuit 34 can be used to output the duplicate current signal to a data line 39 in the reproducing/sustaining status, while the data line 39 is connected to the pixel 40. The data driver 30 is used to control the gray colors of the display panel according to the duplicate current signal.

Please notice that, in the present embodiment, the quantity of the level shifter 32 should not be limited. When being implemented, the level shifter 32 can be replaced by a latch circuit. The major difference between the present embodiment and the prior-art technique lies in the characteristic of the digital-to-analog current converting circuit 34. Please refer to FIG. 4, which is a functional block diagram of a detailed embodiment of the digital-to-analog current converting circuit 34 as shown in FIG. 3. The present embodiment shows conditions in a transforming/storing status. The digital-to-analog current converting circuit 34 includes a digital-to-analog current converter 38, a current storing/reproducing module 42, a control circuit 44, and a data line 39. The digital-to-analog current converter 38 is used to transform a digital signal (6-bit digital signal) into an analog current signal. The current storing/reproducing module 42 can be used to store a predetermined voltage required for conducting the analog current signal in the transforming/storing status. The control circuit 44 is electrically connected between the digital-to-analog current converter 38 and the current storing/reproducing module 42 for receiving the switch signal SW, and switch the digital-to-analog current converting circuit 34 between the transforming/storing status and a reproducing/sustaining status according to the switch signal SW. Please refer to FIG. 5, which is a schematic diagram of a detailed embodiment of the digital-to-analog current converting circuit 34. The digital-to-analog current converter 38 is a current-steering digital-to-analog current converter 38 with higher output impedance for preventing the influence of the current flow of the digital-to-analog current converter 38. In addition, the current storing/reproducing module 42 of the present embodiment includes a capacitor C and a plurality of MOS (Metal-Oxide Semiconductor) transistors, wherein the capacitor C is used to store the predetermined voltage required for conducting the analog current signal. After being provided with some proper external voltage sources, current sources(i, $2i \ldots 2^{N-1}i$), data input (D0, D1' ... DN−1), and ground level, the digital-to-analog current converting circuit 34 can operate well.

Figure 4:
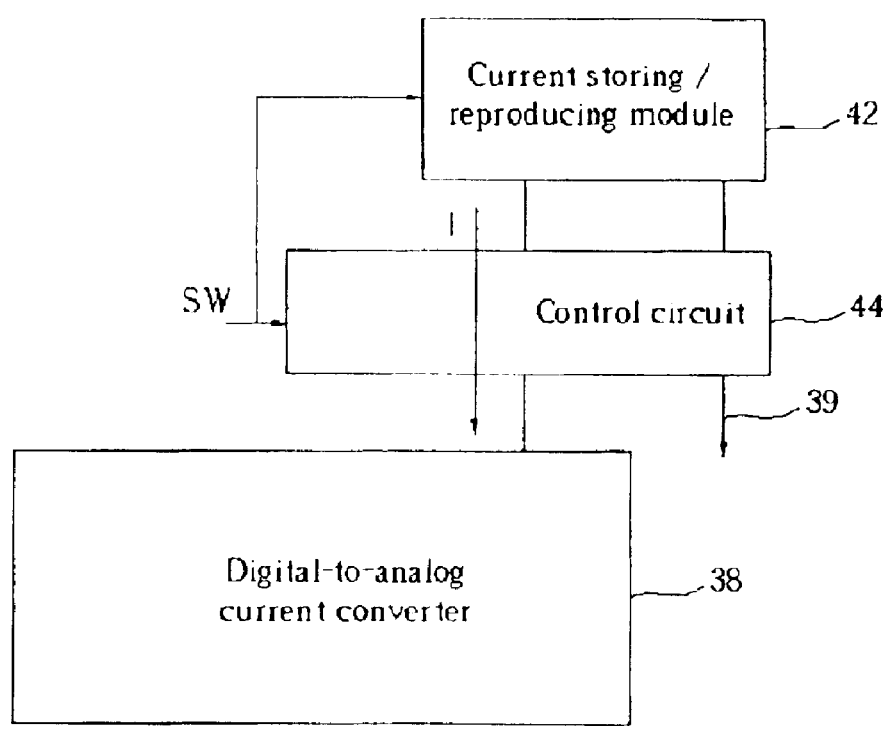
FIG. 4 is a functional block diagram of a detailed embodiment of the digital-to-analog current converting circuit as shown in FIG. 3.
Figure 5:
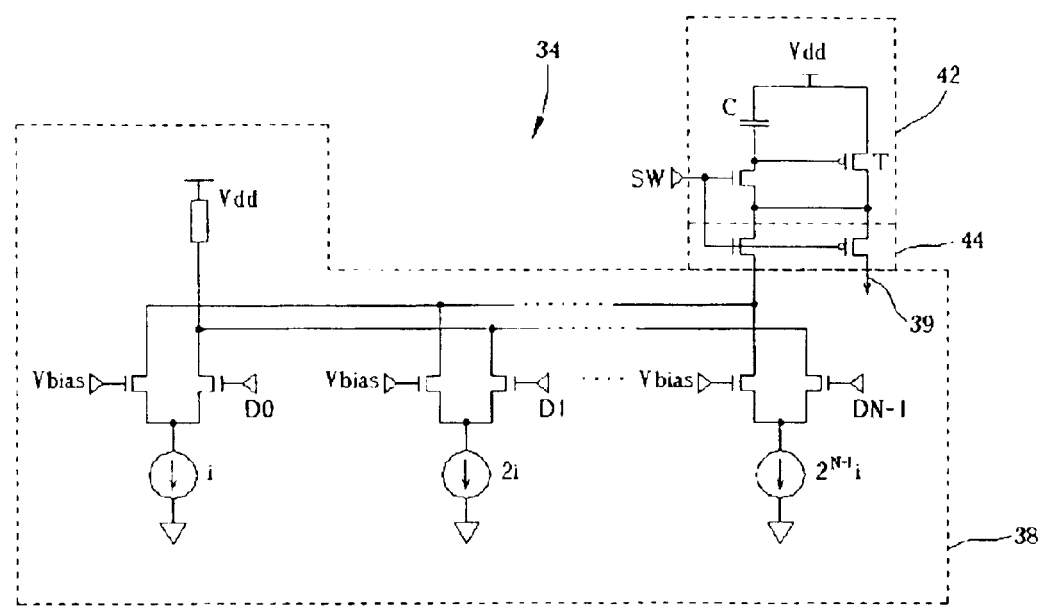
FIG. 5 is a schematic diagram of a detailed embodiment of the digital-to-analog current converting circuit.

The related operations of the digital-to-analog current converting circuit 34 in the transforming/storing status are described in FIG. 4 and FIG. 5. When the switch signal SW received by the control circuit 44 is at a high potential level, the digital-to-analog current converting circuit 34 is in the transforming/storing status. The digital signal will be transformed into a corresponding analog current signal by the digital-to-analog current converter 38. in the transforming/storing status, the control circuit 44 will disconnect the route to the data line 39 and connect the digital-to-analog current converter 38 to the current storing/reproducing module 42. The analog current signal will be conducted into the current storing/reproducing module 42 (the arrow sign I in FIG. 4 represents the direction of current flow). The analog current signal will pass the PMOS transistor T in the current storing/reproducing module 42 to make the capacitor C store the predetermined voltage required for conducting the analog current signal. Therefore, in the present embodiment, the predetermined voltage is a gate-to-source voltage drop (Vgs) of the PMOS transistor T. Please notice that the current storing/reproducing module 42 can be composed of MOS transistors or TFTs. Actually, the type of transistors should not be limited, and the combination among the transistors and the capacitor C is flexible. With different circuit combinations, the design of potential level of the switch signal SW can be adjusted. Moreover, the switch signal SW can be generated by the shift register or other control module.

Figure 6:
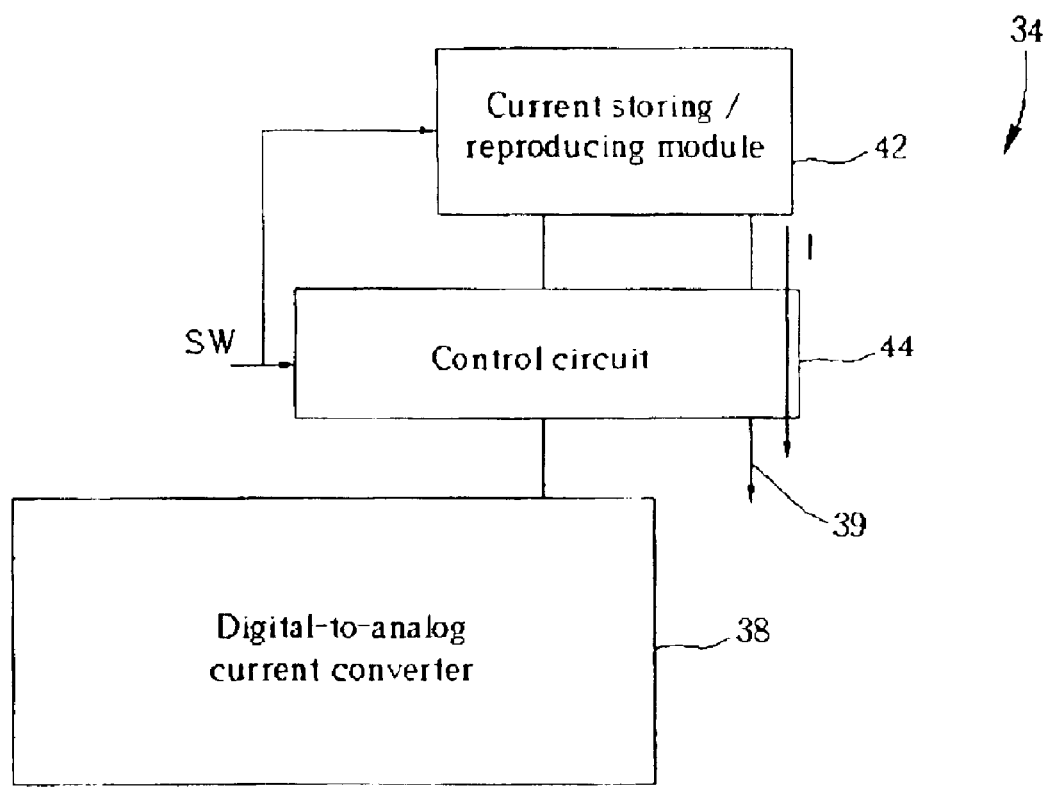
FIG. 6 is a functional block diagram of another embodiment of the digital-to-analog current converting circuit as shown in FIG. 3.

When the switch signal SW goes back to a low potential level, the digital-to-analog current converting circuit 34 is in the reproducing/sustaining status. The operation related to the digital-to-analog current converting circuit 34 in the reproducing/sustaining status can refer to FIG. 5 and FIG. 6. FIG. 6 is a functional block diagram of another embodiment of the digital-to-analog current converting circuit 34 as shown in FIG. 3. FIG. 6 also shows the condition of the digital-to-analog current converting circuit 34 in the reproducing/sustaining status. In the present embodiment, after the control circuit 44 executes the corresponding switch function (the switch signal SW switches from the high potential level to the low potential level), the current storing/reproducing module 42 will conduct a duplicate current signal to the data line 39 in the reproducing/sustaining status. When the digital-to-analog current converting circuit 34 is in the reproducing/sustaining status, the control circuit 44 (used to receive the low-potential-level switch signal SW) will disconnect the route between the digital-to-analog current converter 38 and the current storing/reproducing module 42. Then the duplicate current signal will be conducted to the data line 39 to drive the data line 39 and the corresponding pixel 40. The duplicate current signal is generated by the predetermined voltage previously stored in the current storing/reproducing module 42 in the transforming/storing status. Due to that the predetermined voltage is required to conduct the analog current signal, the duplicate current signal is almost equal to the analog current signal generated by the digital-to-analog current converter 38. Please notice that the type of transistors should not be limited, and the combination among the transistors and the capacitor C is flexible. With different circuit combinations, the design of potential level of the switch signal SW can be adjusted. Moreover, the switch signal SW can be generated by the shift register or other control module.

In addition, the directions of the current flow described in FIG. 4 to FIG. 6 is relative. The direction of the current flow in the reproducing/sustaining status represents that the digital-to-analog current converting circuit 34 plays a role as a current source. If the direction of the current flow is designed reversed, the system should be designed with corresponding modifications.

Figure 7:
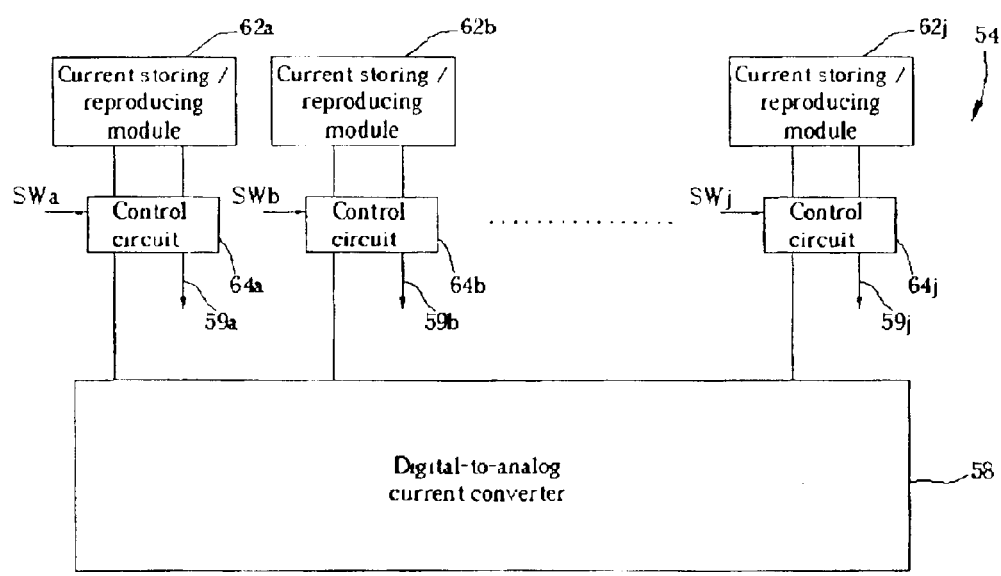
FIG. 7 is a functional block diagram of another embodiment of the digital-to-analog current converting circuit.

Finally, when being implemented, the digital-to-analog current converting circuit of the present invention can be achieved by combining a digital-to-analog current converter with a plurality of current storing/reproducing modules. Therefore, each of the plurality of current storing/reproducing modules should be respectively installed with a control circuit, and each control circuit is electrically connected between the digital-to-analog current converter and the corresponding current storing/reproducing module to switch the current storing/reproducing module between the transforming/storing status and the reproducing/sustaining status. Please refer to FIG. 7, which is a functional block diagram of another embodiment of the digital-to-analog current converting circuit 54. The digital-to-analog current converting circuit 54 of the present embodiment is composed of a digital-to-analog current converter 58 combined with a plurality of current storing/reproducing modules 62a, 62b–62j. Each of the plurality of current storing/reproducing modules 62a, 62b–62j is respectively connected to a control circuit (64a, 64b–64j)and a data line (59a, 59b–59j). The basic operating principles are the same as the above-mentioned embodiments as shown in FIG. 4 to FIG. 6. Each duplicate current signal generated by each corresponding current storing/reproducing module (62a, 62b–62j) is almost equal to the analog current signal generated by the digital-to-analog current converter 38. Each current storing/reproducing module (62a, 62b–62j) corresponds to a data line (59a, 59b–59j). Therefore, each current storing/reproducing module (62a, 62b–62j) can store a predetermined voltage required for conducting the analog current signal in a corresponding transforming/storing status, and conduct the duplicate current signal generated by the predetermined voltage to the corresponding data line (59a, 59b–59j) corresponding to the reproducing/sustaining status. In addition, each switch operation between the transforming/storing status and the analog reproducing/sustaining status in a corresponding current storing/reproducing module (62a, 62b–62j) is based on the corresponding switch signal (Swa, SWb–SWj) received by the corresponding control circuit (64a, 64b–64j). All the switch signals Swa, SWb-SWj can be generated by one or a plurality of shift registers.

The digital-to-analog current converting circuit of the present invention can be applied in an OLED display device, a PLED display device, and other current-driving display devices. The digital-to-analog current converting circuit includes a current-steering digital-to-analog current converter, and comprises one or a plurality of current storing/reproducing modules combined with corresponding control circuits to store a predetermined voltage in a transforming/storing status and to conduct a stable gray-scale current in a reproducing/sustaining status.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog current converting circuit comprising:
   a digital-to-analog current converter for transforming a digital signal into an analog current signal;
   a current storing/reproducing module for storing a predetermined voltage required for conducting the analog current signal in a transforming/storing status and for conducting a duplicate current signal corresponding to the analog current signal to a data line in a reproducing/sustaining status; and
   a control circuit electrically connected between the digital-to-analog current converter and the current storing/reproducing module for switching the digital-to-analog current converting circuit between the transforming/storing status and the reproducing/sustaining status.

2. The digital-to-analog current converting circuit of claim 1, wherein the duplicate current signal is almost equal to the analog current signal.

3. The digital-to-analog current converting circuit of claim 2, wherein the duplicate current signal is generated by the predetermined voltage.

4. The digital-to-analog current converting circuit of claim 1, wherein the current storing/reproducing module comprises at least a capacitor and a plurality of MOS transistors or TFTS, and the predetermined voltage is a gate-to-source voltage drop (Vgs) of a transistor.

5. The digital-to-analog current converting circuit of claim 1, wherein the control circuit is used to receive a switch signal to switch the digital-to-analog current converting circuit between the transforming/storing status and the reproducing/sustaining status.

6. The digital-to-analog current converting circuit of claim 5, wherein if the switch signal is at a high potential level, the digital-to-analog current converting circuit is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal.

7. The digital-to-analog current converting circuit of claim 5, wherein if the switch signal is at a low potential level, the digital-to-analog current converting circuit is in the reproducing/sustaining status, and the control circuit will disconnect the route between the digital-to-analog current converter and the current storing/reproducing module and conduct the duplicate current signal to the data line.

8. The digital-to-analog current converting circuit of claim 5, wherein the switch signal is generated by a shift register.

9. The digital-to-analog current converting circuit of claim 5, wherein if the switch signal is at a first potential level, the digital-to-analog current converting circuit is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal; wherein if the switch signal is at a second potential level, the digital-to-analog current converting circuit is in the reproducing/sustaining status, and the control circuit will disconnect the route between the digital-to-analog current converter and the current storing/reproducing module and connect the duplicate current signal to the data line.

10. The digital-to-analog current converting circuit of claim 1, wherein the digital-to-analog current converter is a current-steering digital-to-analog current converter or another digital-to-analog current converter.

11. The digital-to-analog current converting circuit of claim 1 being applied to an OLED display device, a PLED display device, or another current-driving display device.

12. The digital-to-analog current converting circuit of claim 1, wherein the current storing/reproducing module comprises at least a capacitor and a first transistor, the capacitor being parallel connected between the gate and the source of the first transistor to generate the predetermined voltage, the first transistor being coupled to the data line in a reproducing/sustaining status, and the first transistor being coupled to the digital-to-analog current converting circuit in a transforming/storing status.

13. A digital-to-analog current converting circuit used in a display device, the display device having a pixel, the digital-to-analog current converting circuit comprising:

a current-steering digital-to-analog current converter for transforming a received digital signal into an analog current signal;

a plurality of current storing/reproducing modules, each current storing/reproducing module used for storing a predetermined voltage required for conducting the analog current signal in a corresponding transforming/storing status and for conducting a duplicate current signal to the corresponding data line in a corresponding reproducing/sustaining status, the duplicate current signal being applied for driving the pixel as a stable gray-scale current, and being corresponding to the analog current signal; and a plurality of control circuits respectively electrically connected between the digital-to-analog current converter and the plurality of current storing/reproducing modules for switching the plurality of current storing/reproducing modules between the transforming/storing status and the reproducing/sustaining status;

wherein each duplicate current signal generated by each current storing/reproducing module is almost equal to the analog current signal.

14. The digital-to-analog current converting circuit of claim 13, wherein in each current storing/reproducing module, the duplicate current signal is generated by the predetermined voltage.

15. The digital-to-analog current converting circuit of claim 13, wherein each current storing/reproducing module comprises at least a capacitor and a plurality of MOS transistors or TFTs, and the predetermined voltage is a gate-to-source voltage drop (Vgs) of a transistor.

16. The digital-to-analog current converting circuit of claim 13, wherein each control circuit corresponds to a current storing/reproducing module, and each control circuit is used to receive a corresponding switch signal to switch the corresponding current storing/reproducing module between the transforming/storing status and the reproducing/sustaining status.

17. The digital-to-analog current converting circuit of claim 16, wherein if the switch signal is at a high potential level, the corresponding current storing/reproducing module is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal.

18. The digital-to-analog current converting circuit of claim 16, wherein if the switch signal is at a low potential level, the corresponding current storing/reproducing module is in the reproducing/sustaining status, and the control circuit will disconnect the route between the digital-to-analog current converter and the current storing/reproducing module and conduct the duplicate current signal to the corresponding data line.

19. The digital-to-analog current converting circuit of claim 16, wherein the switch signals are generated by at least a shift register.

20. The digital-to-analog current converting circuit of claim 16, wherein if the switch signal is at a first potential level, the digital-to-analog current converting circuit is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal; wherein if the switch signal is at a second potential level, the digital-to-analog current converting circuit is in the reproducing/sustaining status, and the control circuit will disconnect the route between the digital-to-analog current converter and the current storing/reproducing module and conduct the duplicate current signal to the data line.

21. The digital-to-analog current converting circuit of claim 13, wherein the display device is an OLED display device, a PLED display device, or another current-driving display device.

22. The digital-to-analog current converting circuit of claim 13, wherein the current storing/reproducing module comprises at least a capacitor and a first transistor, the capacitor being parallel connected between the gate and the source of the first transistor to generate the predetermined voltage, the first transistor being coupled to the data line in a reproducing/sustaining status, and the first transistor being coupled to the digital-to-analog current converting circuit in a transforming/storing status.

* * * * *